(12) United States Patent
Dohi

(10) Patent No.: US 10,439,653 B2
(45) Date of Patent: Oct. 8, 2019

(54) LIKELIHOOD GENERATION CIRCUIT AND LIKELIHOOD CALCULATION METHOD

(71) Applicant: MITSUBISHI ELECTRIC CORPORATION, Tokyo (JP)

(72) Inventor: Keisuke Dohi, Tokyo (JP)

(73) Assignee: MITSUBISHI ELECTRIC CORPORATION, Tokyo (JP)

( * ) Notice: Subject to any disclaimer, the term of this patent is extended or adjusted under 35 U.S.C. 154(b) by 0 days.

(21) Appl. No.: 16/063,656

(22) PCT Filed: Mar. 28, 2016

(86) PCT No.: PCT/JP2016/059924
§ 371 (c)(1),
(2) Date: Jun. 18, 2018

(87) PCT Pub. No.: WO2017/168520
PCT Pub. Date: Oct. 5, 2017

(65) Prior Publication Data
US 2018/0367165 A1  Dec. 20, 2018

(51) Int. Cl.
*H03M 13/00* (2006.01)
*H03M 13/45* (2006.01)
(Continued)

(52) U.S. Cl.
CPC .......... *H03M 13/45* (2013.01); *H04L 1/0045* (2013.01); *H04L 1/0047* (2013.01); *H04L 25/067* (2013.01)

(58) Field of Classification Search
CPC .......... G11B 20/1833; G11B 2020/185; G11B 5/3909; G11B 5/3945; G11B 5/235; G11B 5/3106; G11B 5/3146; G11B 5/3967; G11B 2005/0024; G11B 20/1217; H03M 13/353; H03M 13/6343; H03M 13/1111; H03M 13/1117; H03M 13/1102; H03M 13/3761; H03M 13/27; H03M 13/373; H03M 13/09; H03M 13/1515; H03M 13/152;
(Continued)

(56) References Cited

U.S. PATENT DOCUMENTS

2016/0344580 A1   11/2016  Konishi et al.

FOREIGN PATENT DOCUMENTS

JP   2004-147329 A   5/2004
WO  WO 2015/137049 A1   9/2015

*Primary Examiner* — Guerrier Merant
(74) *Attorney, Agent, or Firm* — Birch, Stewart, Kolasch & Birch, LLP

(57) ABSTRACT

Provided is a likelihood generation circuit including: a first likelihood calculation circuit, which includes a table having a reception value and a likelihood associated with each other, and is configured to calculate the likelihood corresponding to the reception value by referring to the table; a second likelihood calculation circuit, which includes an operational expression for calculating a likelihood based on a reception value, and is configured to calculate the likelihood corresponding to the reception value through use of the operational expression; and a likelihood output control circuit configured to: select any one likelihood calculation circuit of the first likelihood calculation circuit and the second likelihood calculation circuit for each reception value based on a reception frequency of the reception value; stop a calculation process of another likelihood calculation circuit that has not been selected; and output the likelihood calculated by the one likelihood calculation circuit that has been selected.

9 Claims, 2 Drawing Sheets

(51) Int. Cl.
*H04L 1/00* (2006.01)
*H04L 25/06* (2006.01)

(58) Field of Classification Search
CPC ................ H03M 13/45; G06F 11/1076; Y10T 428/1121; Y10T 428/1171; Y10T 428/1114; H04L 25/067; H04L 1/0047; H04L 1/0045; H04L 1/0054; H04L 27/38
See application file for complete search history.

LIKELIHOOD GENERATION CIRCUIT AND LIKELIHOOD CALCULATION METHOD

TECHNICAL FIELD

The present invention relates to a communication system including a likelihood generation circuit required for soft-decision error correction decoding involving multi-level discrimination of a reception value.

BACKGROUND ART

In optical communications or other such communication systems, achievement of an increase in capacity and reduction in energy consumption per unit of communication capacity have become pressing issues. Of those, for the achievement of an increase in capacity, a reception value is subjected to multi-level discrimination, and calculation of a likelihood and error correction are performed based on a result of the discrimination, to thereby achieve a communication channel with a large capacity and high reliability.

In regard to the likelihood to be calculated, it is common to obtain, with reference to the reception value, a minimum value of errors (Euclidean distances) from all transmission candidate values of a pattern in which a transmission bit is 1 and a minimum value of errors from all transmission candidate values of a pattern in which a transmission bit is 0, and to set a difference therebetween as a log likelihood ratio (LLR).

When a circuit that operates in real time is constructed, a real-time property is ensured by implementing likelihood generation circuits in parallel with one another. As a result, there is a problem that a circuit scale increases in accordance with a parallel number thereof. An increase in circuit scale causes an increase in energy consumption. That is, as a result of increasing the parallel number in order to achieve an increase in capacity, there arise a problem that the energy consumption of a communication system increases and a problem that heat dissipation becomes difficult.

In view of the foregoing, in order to achieve both the increase in communication capacity and the reduction in energy consumption, there is a related art that employs the following method. That is, there is a related art configured to select a scheme at a time of circuit designing so as to use a scheme excellent in performance but high in energy consumption for a part liable to cause degradation in signal quality and to use a scheme inferior in performance but low in energy consumption for a part that exerts little influence on the signal quality (see, for example, Patent Literature 1).

As another method, in order to achieve an increase in capacity, there is a related art configured to estimate communication channel quality and to dynamically select an optimum error correction algorithm based on a result of the estimation (see, for example, Patent Literature 2).

A reception frequency of a reception value is not uniform and has variations. In addition, a likelihood is uniquely determined when a reception value is obtained. Therefore, in the same manner as in the reception frequency of the reception value, variations occur in a distribution of the calculated likelihood. It is also common that, as the number of kinds of values that can be taken by the reception value becomes smaller, the likelihood calculation circuit becomes simpler and lower in energy consumption.

Therefore, it is possible to lower average energy consumption required for likelihood calculation by providing a likelihood calculation scheme dedicated to a frequently received value and a likelihood calculation scheme for handling all values that can be taken by the reception value, and selecting a likelihood calculation scheme suitable for each reception value.

CITATION LIST

Patent Literature

[PTL 1] WO 2015/137049 A1
[PTL 2] JP 2004-147329 A

SUMMARY OF INVENTION

Technical Problem

However, the related arts have the following problems.

In Patent Literature 1, a scheme to be used for likelihood calculation is statically selected at a time of circuit designing. Therefore, Patent Literature 1 cannot handle a dynamic change in quality of a communication channel. Further, in Patent Literature 2, statistical information based on a plurality of reception values is used for estimation of communication channel quality for selecting a likelihood calculation scheme. Therefore, Patent Literature 2 has a problem that an optimum likelihood calculation scheme cannot be selected for each reception value.

The present invention has been made in order to solve such problems as described above, and has an object to obtain a likelihood generation circuit and a likelihood calculation method, which are capable of handling a dynamic change in quality of a communication channel and selecting an appropriate likelihood calculation scheme for each reception value, to thereby allow reduction in energy consumption while maintaining communication capacity.

Solution to Problem

According to one embodiment of the present invention, there is provided a likelihood generation circuit, which is to be applied to a communication device configured to perform error correction, and is configured to generate a likelihood based on a discrimination result of subjecting a reception value to multi-level discrimination, the likelihood generation circuit including: a first likelihood calculation circuit, which includes a table having a reception value and a likelihood associated with each other, and is configured to calculate the likelihood corresponding to the reception value by referring to the table; a second likelihood calculation circuit, which includes an operational expression for calculating a likelihood based on a reception value, and is configured to calculate the likelihood corresponding to the reception value through use of the operational expression; and a likelihood output control circuit configured to: select any one likelihood calculation circuit of the first likelihood calculation circuit and the second likelihood calculation circuit for each reception value based on a reception frequency of the reception value; stop a calculation process of another likelihood calculation circuit that has not been selected; and output the likelihood calculated by the one likelihood calculation circuit that has been selected.

According to one embodiment of the present invention, there is provided a likelihood calculation method, which is executed by a communication device configured to generate a likelihood based on a discrimination result of subjecting a reception value to multi-level discrimination to perform error correction, the likelihood calculation method including: a first step of storing, in a storage unit in advance: a table in which a likelihood is associated with a reception value expected to have a reception frequency equal to or higher than a determination frequency set in advance; and an operational expression for calculating a likelihood based on a reception value; a second step of determining whether the reception frequency of a received reception value is equal to or higher than the determination frequency based on distribution information on the reception value, which is provided in advance, or a histogram created from a set of a given amount of reception values received before; a third step of executing a first likelihood calculation process for calculating the likelihood corresponding to the received reception value through use of the table in response to reception of a first execution instruction; a fourth step of executing a second likelihood calculation process for calculating the likelihood corresponding to the received reception value through use of the operational expression in response to reception of a second execution instruction; a fifth step of outputting, when the reception frequency of the received reception value is equal to or higher than the determination frequency and the likelihood corresponding to the received reception value is held in the table, the first execution instruction to cause the first likelihood calculation process to be executed, and setting the second likelihood calculation process to an unexecuted state by avoiding outputting the second execution instruction; a sixth step of outputting, when the reception frequency of the received reception value is lower than the determination frequency, the second execution instruction to cause the second likelihood calculation process to be executed, and setting the first likelihood calculation process to an unexecuted state by avoiding outputting the first execution instruction; and a seventh step of outputting, when the reception frequency of the received reception value is equal to or higher than the determination frequency and the likelihood corresponding to the received reception value is not held in the table, the second execution instruction to cause the second likelihood calculation process to be executed, setting the first likelihood calculation process to the unexecuted state by avoiding outputting the first execution instruction, and updating the table by associating the likelihood calculated by the second likelihood calculation process with the received reception value.

Advantageous Effects of Invention

According to the present invention, there is provided a configuration to select a circuit to be operated to calculate the likelihood in accordance with the reception frequency of the reception value, and to stop a circuit that has not been selected. As a result, it is possible to obtain the likelihood generation circuit and the likelihood calculation method, which are capable of handling a dynamic change in quality of a communication channel and selecting an appropriate likelihood calculation scheme for each reception value, to thereby allow reduction in energy consumption while maintaining communication capacity.

DESCRIPTION OF EMBODIMENTS

Now, a likelihood generation circuit and a likelihood calculation method according to preferred embodiments of the present invention are described below with reference to the accompanying drawings.

First Embodiment

Figure 1:
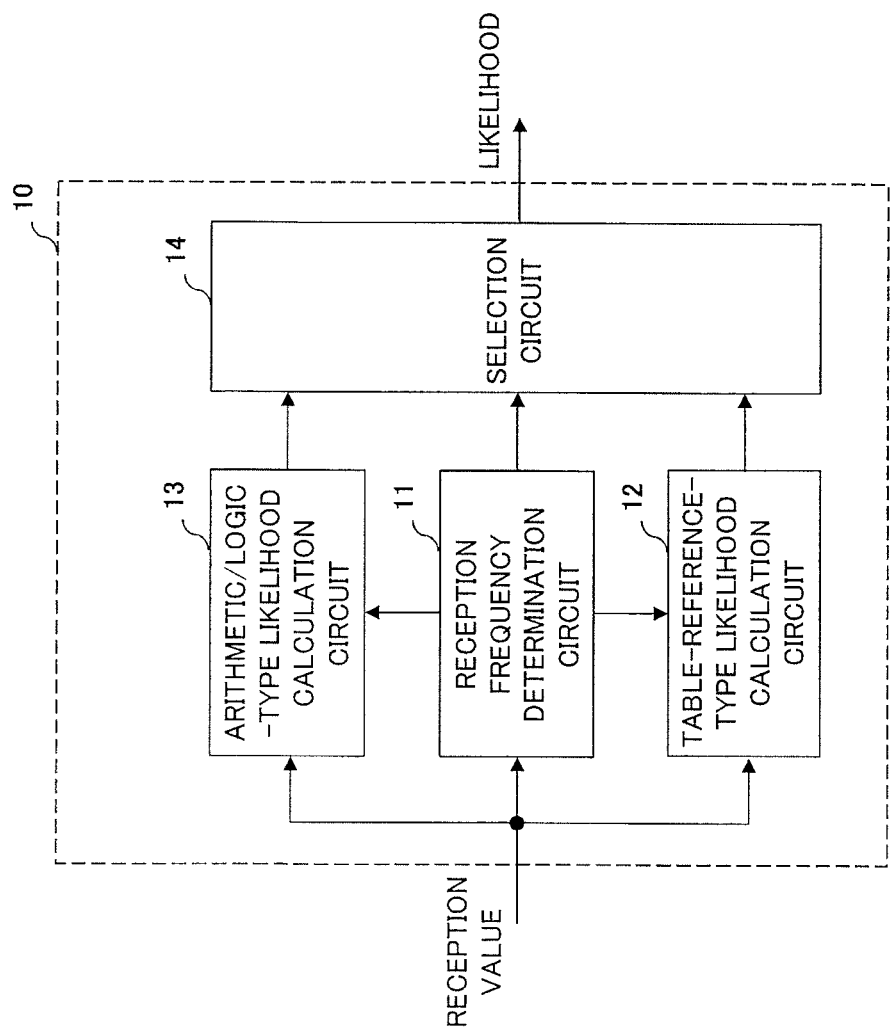
FIG. 1 is a diagram for illustrating a configuration example of an optical communication system in a first embodiment of the present invention.

FIG. 1 is a diagram for illustrating a configuration example of an optical communication system in a first embodiment of the present invention. An optical communication system 10 in the first embodiment includes a reception frequency determination circuit 11, a table-reference-type likelihood calculation circuit 12, an arithmetic/logic-type likelihood calculation circuit 13, and a selection circuit 14. In this case, the reception frequency determination circuit 11 and the selection circuit 14 correspond to a likelihood output control circuit configured to control switching of a likelihood calculation scheme in accordance with an occurrence frequency of a reception value.

The optical communication system 10 receives input of a reception value as an input signal, and outputs a likelihood as an output signal. As the input signal, a plurality of reception values may be simultaneously input. In that case, the plurality of reception values are independently processed, and respective likelihoods that have been calculated are output.

The reception value input to the optical communication system 10 is input to each of the reception frequency determination circuit 11, the table-reference-type likelihood calculation circuit 12, and the arithmetic/logic-type likelihood calculation circuit 13.

The reception frequency determination circuit 11 determines, based on the reception frequency of the reception value, which likelihood calculation circuit of the table-reference-type likelihood calculation circuit 12 and the arithmetic/logic-type likelihood calculation circuit 13 is to be used. In performing the determination, the reception frequency determination circuit 11 can calculate the reception frequency of the received reception value based on distribution information on the reception value, which is provided in advance. In another case, the reception frequency determination circuit 11 can also estimate the reception frequency of the currently received reception value by creating a histogram from a set of a given amount of reception values received before.

Further, the reception frequency determination circuit 11 can perform the above-mentioned determination by subjecting the reception value to addition, multiplication, a logical operation, reference to a table, or the like. At that time, in addition to the reception value, the reception frequency determination circuit 11 may use a value held inside the circuit or a value other than the reception value supplied from the outside. The value held inside the circuit can also be updated while the circuit is in operation.

Then, the reception frequency determination circuit 11 can compare the reception frequency of the reception value to a determination frequency set in advance to select the table-reference-type likelihood calculation circuit 12 when the reception frequency is equal to or higher than the determination frequency, and to select the arithmetic/logic-type likelihood calculation circuit 13 when the reception frequency is lower than the determination frequency. Instead of being a fixed value, the determination frequency can be dynamically changed depending on a reception environment.

Of the table-reference-type likelihood calculation circuit 12 and the arithmetic/logic-type likelihood calculation circuit 13, the reception frequency determination circuit 11 outputs a stop signal to one of the likelihood calculation circuits determined not to be used for likelihood calculation. In addition, the reception frequency determination circuit 11 outputs a result of the determination to the selection circuit 14 as a selection signal for the likelihood.

When a plurality of reception values are simultaneously input to the reception frequency determination circuit 11, the above-mentioned stop signal and the above-mentioned selection signal are generated and output in association with each of the plurality of reception values.

The table-reference-type likelihood calculation circuit 12 includes a table in which an address corresponding to a reception value and a likelihood are associated with each other. The table-reference-type likelihood calculation circuit 12 generates an address to be used for referring to the table through use of the reception value, and extracts the likelihood corresponding to the address from the table. At this time, the table-reference-type likelihood calculation circuit 12 may use the reception value itself as the address, or may use a result of subjecting the reception value to an arithmetic/logic operation as the address.

The table is not limited to data set in advance, and can be sequentially updated. For example, when the reception frequency of the reception value is changed due to a change of state of a communication channel or a system, a change of an operation parameter for the system, or other such factors, the table-reference-type likelihood calculation circuit 12 may dynamically update the contents of the reception value and the likelihood, which are held in the table, in accordance with the changed reception frequency.

When the likelihood corresponding to the reception value is not held in the table, the table-reference-type likelihood calculation circuit 12 can internally calculate the likelihood through an arithmetic/logic operation to update the table through use of the calculated likelihood. By the above-mentioned update process, from then on, the reception values that allow the likelihood to be extracted in a short period of time with reference to the table can be dynamically maintained in the table.

When receiving the stop signal from the reception frequency determination circuit 11, the table-reference-type likelihood calculation circuit 12 stops a calculation processing operation, to thereby be able to achieve the reduction in energy consumption.

When a plurality of reception values and a plurality of stop signals are simultaneously input, the table-reference-type likelihood calculation circuit 12 can stop the operation for the likelihood calculation for the reception value associated with the stop signal, and can calculate the likelihood for only the reception value for which the stop signal has not been input. Even by such a process, it is possible to achieve the reduction in energy consumption.

Meanwhile, the arithmetic/logic-type likelihood calculation circuit 13 uses the input reception value to calculate the likelihood through the four fundamental arithmetic operations, the logical operation, the reference to the table, or the like. In performing the calculation, in addition to the reception value, the arithmetic/logic-type likelihood calculation circuit 13 may use a value held inside the circuit or a value other than the reception value supplied from the outside.

When receiving the stop signal from the reception frequency determination circuit 11, the arithmetic/logic-type likelihood calculation circuit 13 stops a calculation processing operation, to thereby be able to achieve the reduction in energy consumption.

When a plurality of reception values and a plurality of stop signals are simultaneously input, the arithmetic/logic-type likelihood calculation circuit 13 can stop the operation for the likelihood calculation for the reception value associated with the stop signal, and can calculate the likelihood for only the reception value for which the stop signal has not been input. Even by such a process, it is possible to achieve the reduction in energy consumption.

The selection circuit 14 includes two or more likelihood input terminals and one or more selection signal input terminals, and selects the likelihood output from each of the table-reference-type likelihood calculation circuit 12 and the arithmetic/logic-type likelihood calculation circuit 13 based on the selection signal received from the reception frequency determination circuit 11.

The above-mentioned table-reference-type likelihood calculation circuit 12 can extract a likelihood held in the table in a short period of time without performing an arithmetic/logic process. The table-reference-type likelihood calculation circuit 12 has a feature that an arithmetic/logic process is required for a likelihood that is not held in the table, which increases a processing time period. However, the table-reference-type likelihood calculation circuit 12 can incorporate a likelihood calculated through the arithmetic/logic process once before into the table.

Meanwhile, the arithmetic/logic-type likelihood calculation circuit 13 calculates the likelihood from the reception value by combining an adder, a multiplier, and other such arithmetic/logic units. Therefore, although a time period for the arithmetic/logic process is required, the arithmetic/logic-type likelihood calculation circuit 13 can calculate the likelihood for more kinds of reception values than in the case of the table-reference-type likelihood calculation circuit 12 for the same processing time period.

Therefore, for the reception value having a higher reception frequency than the determination frequency, it is more advantageous to calculate the likelihood by the table-reference-type likelihood calculation circuit 12 through use of the data provided as the table.

As described above, according to the first embodiment, each time a reception value is received, a likelihood calculation circuit of any one of a table reference type and an arithmetic/logic type can be selected in accordance with the reception frequency of the reception value, and the likelihood calculation circuit that has not been selected can be stopped. Further, it is possible to update the table of a table-reference-type likelihood calculation circuit in accordance with a dynamic change in quality of the communication channel.

In other words, the table-reference-type likelihood calculation circuit holds, in the table, a part of likelihoods having a high occurrence frequency among likelihoods that can be calculated by the arithmetic/logic-type likelihood calculation circuit. Therefore, when a correspondence relationship between the likelihood and the reception value is provided as the table, the likelihood can be calculated with lower energy than in the case of using the arithmetic/logic process performed by the arithmetic/logic-type likelihood calculation circuit.

Further, when the likelihood is calculated by the table-reference-type likelihood calculation circuit, the arithmetic/logic-type likelihood calculation circuit is stopped, to thereby achieve the reduction in energy consumption. In addition, the table can be dynamically updated depending on an actual reception state of the reception value.

As a result, it is possible to achieve a communication system including a likelihood generation circuit capable of handling a dynamic change in quality of the communication channel and selecting an appropriate likelihood calculation scheme for each reception value to achieve energy savings.

Second Embodiment

The description of the first embodiment is directed to the case of including the reception frequency determination circuit 11 to select the likelihood calculation circuit after directly obtaining the reception frequency of the reception value. In contrast, in a second embodiment of the present invention, a description is given of a communication system capable of producing, without including the reception frequency determination circuit 11, an effect equivalent to that of the first embodiment by indirectly taking the reception frequency into consideration.

Figure 2:
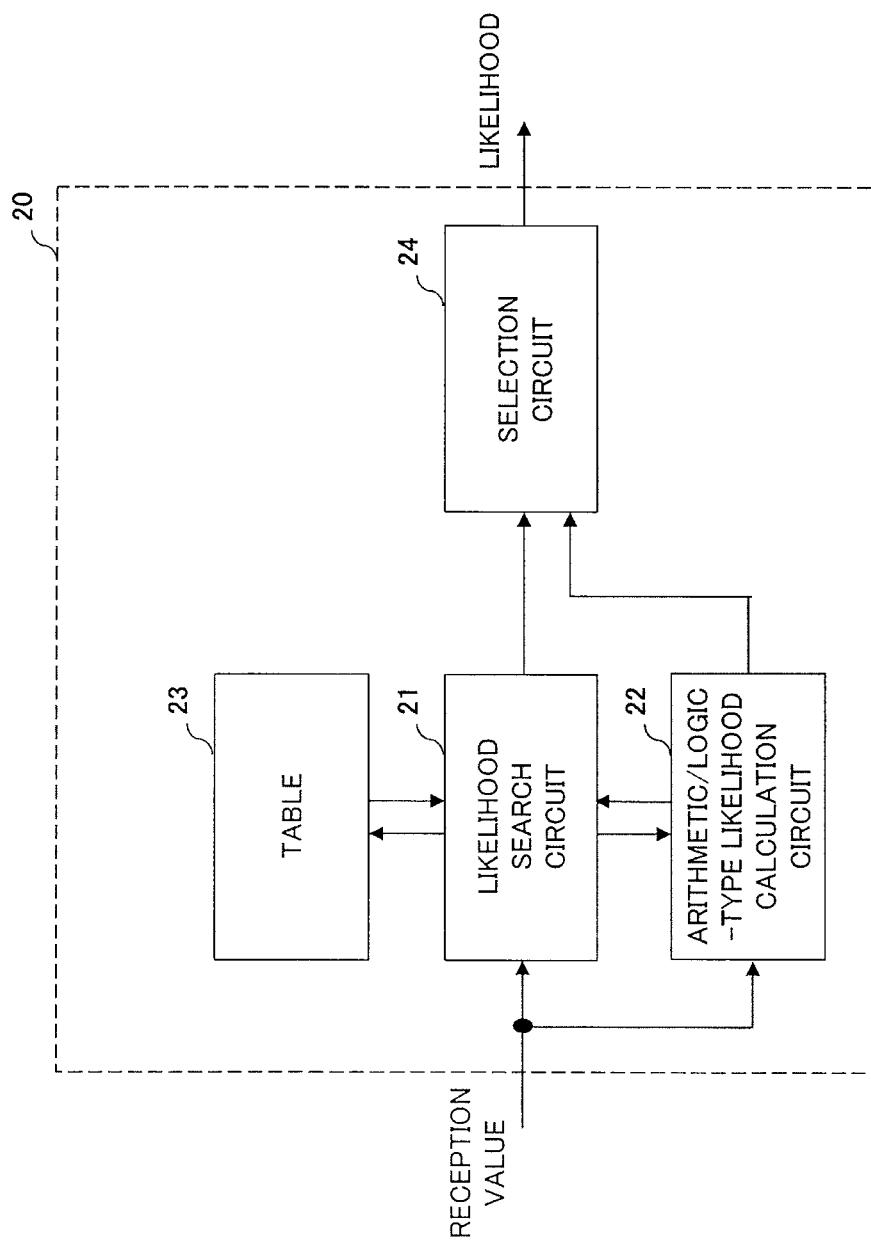
FIG. 2 is a diagram for illustrating a configuration example of an optical communication system in a second embodiment of the present invention.

FIG. 2 is a diagram for illustrating a configuration example of an optical communication system in a second embodiment of the present invention. An optical communication system 20 in the second embodiment includes a likelihood search circuit 21, an arithmetic/logic-type likelihood calculation circuit 22, a table 23, and a selection circuit 24. In this case, the likelihood search circuit 21 and the selection circuit 24 correspond to a likelihood output control circuit configured to control switching of a likelihood calculation scheme in accordance with an occurrence frequency of a reception value.

The optical communication system 10 receives input of a reception value as an input signal, and outputs a likelihood as an output signal. As the input signal, a plurality of reception values may be simultaneously input. In that case, the plurality of reception values are independently processed, and respective likelihoods that have been calculated are output.

The reception value input to the optical communication system 20 is input to each of the likelihood search circuit 21 and the arithmetic/logic-type likelihood calculation circuit 22.

The likelihood search circuit 21 searches the table 23 to examine based on the received reception value whether or not a likelihood corresponding to the reception value is held in the table 23. When the likelihood corresponding to the reception value is not held in the table 23, the likelihood search circuit 21 uses the arithmetic/logic-type likelihood calculation circuit 22 to calculate the likelihood corresponding to the reception value.

The likelihood calculated by the arithmetic/logic-type likelihood calculation circuit 22 is transmitted to the selection circuit 24 and the likelihood search circuit 21. The likelihood search circuit 21, which has received the new likelihood calculated by the arithmetic/logic-type likelihood calculation circuit 22, updates the table 23 by deleting the oldest likelihood in the table 23 and associating the received new likelihood with the reception value as the most recent piece of data.

Meanwhile, when the likelihood corresponding to the reception value is found in the table 23, the likelihood search circuit 21 extracts the likelihood corresponding to the reception value from the table 23, and outputs the stop signal to the arithmetic/logic-type likelihood calculation circuit 22, to thereby suspend the arithmetic/logic process. The likelihood search circuit 21 also updates the table 23 so as to set the likelihood found in the table 23 as the most recent piece of data in the table 23.

In the optical communication system 20 in the second embodiment having such a configuration, the reception frequency is not directly obtained, and the likelihood calculation is executed by using a likelihood held in the table 23 for a frequently received value and using a likelihood calculated by the arithmetic/logic-type likelihood calculation circuit 22 for a reception value having such a low reception frequency as to have no corresponding likelihood held in the table 23.

In other words, the optical communication system 20 in the second embodiment is configured to indirectly use the reception frequency of the reception value, instead of directly obtaining the reception frequency, by holding a finite number of reception values that have been recently received and the likelihoods corresponding thereto as the table. As a result, it is possible to reduce energy consumption required for the likelihood calculation for the frequently received value, and to lower average energy consumption required for the likelihood calculation.

The description of the above-mentioned example is directed to the case of updating the table 23 so as to hold in the table 23 the likelihoods corresponding to the finite number of reception values that have been recently received, but the table 23 may have another structure. For example, the likelihood search circuit 21 may also create a histogram regarding a finite number of reception values that have been received so far, and dynamically identify the reception value having a higher occurrence frequency with a higher priority, to thereby be able to update the table 23.

As described above, according to the second embodiment, each time a reception value is received, the likelihood calculation can be performed by referring to the table in the case where the reception value has been recently received, while the likelihood calculation can be performed through the arithmetic/logic operation in the case where the reception value has not been recently received. Further, it is possible to update the table based on the finite number of reception values that have been recently received. As a result, it is possible to achieve a communication system including a likelihood generation circuit capable of updating the table in accordance with a dynamic change in quality of the communication channel and selecting an appropriate likelihood calculation scheme for each reception value to achieve energy savings.

The invention claimed is:

1. A likelihood generation circuit, which is to be applied to a communication device configured to perform error correction, and is configured to generate a likelihood based on a discrimination result of subjecting a reception value to multi-level discrimination, the likelihood generation circuit comprising:
   a first likelihood calculation circuit, which includes a table having a reception value and a likelihood associated with each other, and is configured to calculate the likelihood corresponding to the reception value by referring to the table;
   a second likelihood calculation circuit, which includes an operational expression for calculating a likelihood based on a reception value, and is configured to calculate the likelihood corresponding to the reception value through use of the operational expression; and
   a likelihood output control circuit configured to:
      select any one likelihood calculation circuit of the first likelihood calculation circuit and the second likelihood calculation circuit for each reception value based on a reception frequency of the reception value;

stop a calculation process of another likelihood calculation circuit that has not been selected; and output the likelihood calculated by the one likelihood calculation circuit that has been selected.

2. A likelihood generation circuit according to claim 1, wherein the likelihood output control circuit is configured to:

identify the reception frequency for each received reception value based on distribution information on the reception value, which is provided in advance;

select, when the reception frequency is equal to or higher than a determination frequency set in advance, the first likelihood calculation circuit as the one likelihood calculation circuit, and output a control signal for stopping a likelihood calculation process to the second likelihood calculation circuit that has not been selected; and select, when the reception frequency is lower than the determination frequency, the second likelihood calculation circuit as the one likelihood calculation circuit, and output the control signal for stopping the likelihood calculation process to the first likelihood calculation circuit that has not been selected.

3. A likelihood generation circuit according to claim 1, wherein the likelihood output control circuit is configured to:

dynamically identify the reception frequency for each received reception value based on a histogram created from a set of a given amount of reception values received before;

select, when the reception frequency is equal to or higher than a determination frequency set in advance, the first likelihood calculation circuit as the one likelihood calculation circuit, and output a control signal for stopping a likelihood calculation process to the second likelihood calculation circuit that has not been selected; and select, when the reception frequency is lower than the determination frequency, the second likelihood calculation circuit as the one likelihood calculation circuit, and output the control signal for stopping the likelihood calculation process to the first likelihood calculation circuit that has not been selected.

4. A likelihood generation circuit according to claim 2, wherein, when the first likelihood calculation circuit is selected as the one likelihood calculation circuit by the likelihood output control circuit and the likelihood corresponding to the received reception value does not exist in the table, the first likelihood calculation circuit calculates the likelihood through use of the operational expression, and dynamically updates the table through use of a result of the calculation.

5. A likelihood generation circuit according to claim 1, wherein the likelihood output control circuit is configured to:

search the table included in the first likelihood calculation circuit to examine whether a likelihood corresponding to a received reception value is held in the table;

select, when the likelihood corresponding to the received reception value is held in the table, the first likelihood calculation circuit as the one likelihood calculation circuit, and output a control signal for stopping a likelihood calculation process to the second likelihood calculation circuit that has not been selected; and select, when the likelihood corresponding to the received reception value is not held in the table, the second likelihood calculation circuit as the one likelihood calculation circuit, output the control signal for stopping the likelihood calculation process to the first likelihood calculation circuit that has not been selected, and dynamically update the table through use of the likelihood calculated by the second likelihood calculation circuit.

6. A likelihood generation circuit according to claim 5, wherein the likelihood output control circuit is configured to dynamically update the table by performing an update process so as to hold, in the table, likelihoods corresponding to a finite number of reception values that have been recently received.

7. A likelihood generation circuit according to claim 5, wherein the likelihood output control circuit is configured to dynamically update the table by performing an update process so as to hold a reception value having a higher occurrence frequency in the table with a higher priority based on a histogram created from a set of a given amount of reception values received before.

8. A likelihood calculation method, which is executed by a communication device configured to generate a likelihood based on a discrimination result of subjecting a reception value to multi-level discrimination to perform error correction, the likelihood calculation method comprising:

a first step of storing, in a storage unit in advance:
    a table in which a likelihood is associated with a reception value expected to have a reception frequency equal to or higher than a determination frequency set in advance; and
    an operational expression for calculating a likelihood based on a reception value;

a second step of determining whether the reception frequency of a received reception value is equal to or higher than the determination frequency based on distribution information on the reception value, which is provided in advance, or a histogram created from a set of a given amount of reception values received before;

a third step of executing a first likelihood calculation process for calculating the likelihood corresponding to the received reception value through use of the table in response to reception of a first execution instruction;

a fourth step of executing a second likelihood calculation process for calculating the likelihood corresponding to the received reception value through use of the operational expression in response to reception of a second execution instruction;

a fifth step of outputting, when the reception frequency of the received reception value is equal to or higher than the determination frequency and the likelihood corresponding to the received reception value is held in the table, the first execution instruction to cause the first likelihood calculation process to be executed, and setting the second likelihood calculation process to an unexecuted state by avoiding outputting the second execution instruction;

a sixth step of outputting, when the reception frequency of the received reception value is lower than the determination frequency, the second execution instruction to cause the second likelihood calculation process to be executed, and setting the first likelihood calculation process to an unexecuted state by avoiding outputting the first execution instruction; and a seventh step of outputting, when the reception frequency of the received reception value is equal to or higher than the determination frequency and the likelihood corresponding to the received reception value is not held in the table, the second execution instruction to cause the second likelihood calculation process to be executed, setting the first likelihood calculation process to the unexecuted state by avoiding outputting the first execution instruction, and updating the table by associating the likelihood calculated by the second likelihood calculation process with the received reception value.

9. A likelihood generation circuit according to claim 3, wherein, when the first likelihood calculation circuit is selected as the one likelihood calculation circuit by the likelihood output control circuit and the likelihood corresponding to the received reception value does not exist in the table, the first likelihood calculation circuit calculates the likelihood through use of the operational expression, and dynamically updates the table through use of a result of the calculation.

\* \* \* \* \*